United States Patent
Ye et al.

(10) Patent No.: US 10,120,256 B2
(45) Date of Patent: Nov. 6, 2018

(54) PREPARATION METHOD FOR THIN FILM TRANSISTOR, PREPARATION METHOD FOR ARRAY SUBSTRATE, ARRAY SUBSTRATE, AND DISPLAY APPARATUS

(71) Applicants: BOE TECHNOLOGY GROUP CO., LTD., Beijing (CN); ORDOS YUANSHENG OPTOELECTRONICS CO., LTD., Ordos, Inner Monogolia (CN)

(72) Inventors: Lulu Ye, Beijing (CN); Huafeng Liu, Beijing (CN); Jingping Lv, Beijing (CN); Lei Yang, Beijing (CN); Meng Yang, Beijing (CN); Kai Zhang, Beijing (CN); Chao Wang, Beijing (CN); Chaochao Sun, Beijing (CN); Shengwei Zhao, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/521,471

(22) PCT Filed: Dec. 31, 2015

(86) PCT No.: PCT/CN2015/100170
§ 371 (c)(1),
(2) Date: Apr. 24, 2017

(87) PCT Pub. No.: WO2017/028461
PCT Pub. Date: Feb. 23, 2017

(65) Prior Publication Data
US 2017/0329163 A1 Nov. 16, 2017

(30) Foreign Application Priority Data

Aug. 14, 2015 (CN) .......................... 2015 1 0502027

(51) Int. Cl.
*H01L 21/77* (2017.01)
*G02F 1/1368* (2006.01)
(Continued)

(52) U.S. Cl.
CPC ...... *G02F 1/1368* (2013.01); *G02F 1/134363* (2013.01); *G02F 1/136227* (2013.01);
(Continued)

(58) Field of Classification Search
None
See application file for complete search history.

(56) References Cited

U.S. PATENT DOCUMENTS

| 6,097,038 A | 8/2000 | Jinno |
| 7,306,980 B2 * | 12/2007 | Takehashi ......... H01L 29/66757 257/E21.413 |

(Continued)

FOREIGN PATENT DOCUMENTS

| CN | 101114619 A | 1/2008 |
| CN | 101894807 A | 11/2010 |

(Continued)

OTHER PUBLICATIONS

The First Chinese Office Axtion dated Aug. 2, 2017; Appln. 201510502027.5.
(Continued)

*Primary Examiner* — Abul Kalam
(74) *Attorney, Agent, or Firm* — Ladas & Parry LLP

(57) ABSTRACT

Preparation method for a thin film transistor, preparation method for an array substrate, an array substrate, and a display apparatus are provided. The preparation method for
(Continued)

a thin film transistor includes: forming, on a pattern of a semiconductor layer, a first photoresist pattern including a photoresist with two different thicknesses, and performing a heavily-doped ion implantation process on the pattern of the semiconductor layer by using the first photoresist pattern as a barrier mask; ashing the first photoresist pattern to remove the photoresist with a second thickness and to thin the photoresist with a first thickness, so as to form a second photoresist pattern; and performing a lightly-doped ion implantation process on the pattern of the semiconductor layer by using the second photoresist pattern as a barrier mask.

15 Claims, 10 Drawing Sheets

(51) Int. Cl.
     *H01L 27/12*      (2006.01)
     *H01L 27/32*      (2006.01)
     *G02F 1/1343*     (2006.01)
     *G02F 1/1362*     (2006.01)
(52) U.S. Cl.
     CPC ............ *H01L 21/77* (2013.01); *H01L 27/124* (2013.01); *H01L 27/32* (2013.01); *H01L 27/3244* (2013.01)

(56) References Cited

U.S. PATENT DOCUMENTS

| | | | |
|---|---|---|---|
| 7,638,375 B2 | 12/2009 | Chin et al. | |
| 2002/0182833 A1* | 12/2002 | Yang | H01L 21/28123 438/587 |
| 2004/0229415 A1* | 11/2004 | Takehashi | H01L 29/66757 438/163 |
| 2007/0040174 A1* | 2/2007 | Kim | H01L 27/1214 257/59 |
| 2009/0111247 A1* | 4/2009 | Tanaka | C30B 29/06 438/479 |
| 2012/0119232 A1* | 5/2012 | Song | H01L 27/1288 257/88 |
| 2012/0171822 A1* | 7/2012 | Yuan | H01L 21/0274 438/166 |
| 2013/0153906 A1 | 6/2013 | Ryu et al. | |
| 2016/0211284 A1* | 7/2016 | Zhang | H01L 29/78621 |
| 2016/0343745 A1 | 11/2016 | Xue et al. | |
| 2016/0343746 A1 | 11/2016 | Xue et al. | |

FOREIGN PATENT DOCUMENTS

| | | |
|---|---|---|
| CN | 103165529 A | 6/2013 |
| CN | 104485278 A | 4/2014 |
| CN | 104517896 A | 4/2015 |
| CN | 105097552 A | 11/2015 |
| JP | 10-275916 A | 10/1996 |
| KR | 1020050105869 A | 11/2005 |

OTHER PUBLICATIONS

International Search Report and Written Opinion dated May 20, 2016; PCT/CN2016/100170.
The Second Chinese Office Action dated Feb. 7, 2018; Appln. No. 201510502027.5.

* cited by examiner

PREPARATION METHOD FOR THIN FILM TRANSISTOR, PREPARATION METHOD FOR ARRAY SUBSTRATE, ARRAY SUBSTRATE, AND DISPLAY APPARATUS

TECHNICAL FIELD

At least one embodiment of the present invention relates to a method for manufacturing a thin-film transistor (TFT), a method for manufacturing an array substrate, an array substrate and a display device.

BACKGROUND

TFT is a thin-film type semiconductor device and is widely applied in the fields such as display technology and integrated circuit technology. In general, in a liquid crystal display (LCD) or an organic light-emitting diode (OLED) display, each pixel unit is driven by a TFT integrated in the rear of the pixel unit, so that image information can be displayed at high speed, high brightness and high contrast. Generally, TFTs may be mainly divided into amorphous silicon (a-Si) TFTs, polycrystalline silicon (poly-Si) TFTs and oxide TFTs according to the composition of TFT semiconductor layers.

As for LCDs and OLEDs, the electron mobility of the poly-Si TFTs may reach 50-200 $cm^2/Vs$, so poly-Si TFT-LCDs have the advantages of higher resolution, rapider response speed, higher aperture opening ratio, etc. In addition, the poly-Si TFT is also a technology platform for developing active matrix organic light-emitting diode (AMOLED) panels. The poly-Si TFT may adopt low working voltage and can reduce the consuming current as a driving backplane of the AMOLED panel.

However, due to the regular arrangement of crystal lattices in the poly-Si TFT, the resistance of electrons in the poly-Si TFT is small, so the serious problem of leakage current can be caused in the off state, and hence the normal use of the poly-Si TFT can be affected. In order to inhibit the leakage current of the TFT, the means of light dope between the source and drain of the TFT is usually adopted. On one hand, the OFF leakage current of pixel switches can be reduced. On the other hand, the phenomenon of hot electron deterioration of peripheral circuits can be improved, and then the reliability can be improved. But in this case, the processing steps of the TFT can be increased; the production time can be increased; and the product yield can be reduced. Moreover, as the critical dimension of lightly doped regions of the source and the drain is difficult to control, the uniformity of products can be reduced.

SUMMARY

At least one embodiment of the present invention provides a manufacturing method of thin-film transistor (TFT), a method for manufacturing an array substrate, an array substrate and a display device. The method for manufacturing the TFT can accurately and highly efficiently control the critical dimension of lightly doped regions of a source and a drain, not only can ensure the production efficiency but also can ensure the product uniformity, and also solves the problem of leakage current. Moreover, compared with the prior art, the processing steps are reduced, so the addition of defects caused by the increase of the processing steps and the production time can be more easily controlled, and hence the method can shorten the production time, reduce the production cost and improve the product quality.

At least one embodiment of the invention provides a method for manufacturing a thin-film transistor (TFT), comprising: forming a pattern of a semiconductor layer on a base substrate; forming a first photoresist pattern on the pattern of the semiconductor layer, the first photoresist pattern including first-thickness photoresist and second-thickness photoresist; the first-thickness photoresist corresponding to an area, at which a channel region is to be formed, in the pattern of the semiconductor layer; the second-thickness photoresist corresponding to areas, at which a source lightly doped region and a drain lightly doped region are to be formed, in the pattern of the semiconductor layer; the first-thickness photoresist has a thickness greater than that of the second-thickness photoresist; performing heavily doped ion implantation on the pattern of the semiconductor layer by taking the first photoresist pattern as a barrier mask, and forming patterns of a source heavily doped region and a drain heavily doped region; performing ashing treatment on the first photoresist pattern, so as to remove the second-thickness photoresist and reduce the thickness of the first-thickness photoresist, and form a second photoresist pattern; performing lightly doped ion implantation on the pattern of the semiconductor layer by taking the second photoresist pattern as a barrier mask, and forming patterns of the channel region, the source lightly doped region and the drain lightly doped region; and removing the second photoresist pattern.

For example, in the method for manufacturing the TFT according to one embodiment of the invention, a source of the TFT is formed by the source lightly doped region and the source heavily doped region; a drain of the TFT is formed by the drain lightly doped region and the drain heavily doped region; and the source and the drain has an interval therebetween so as to define the channel region.

For example, in the method for manufacturing the TFT according to one embodiment of the invention, the second-thickness photoresist is located on both sides of the first-thickness photoresist.

For example, in the method for manufacturing the TFT according to one embodiment of the invention, an interlayer dielectric layer is further formed on the pattern of the semiconductor layer; and the first photoresist pattern is formed on the interlayer dielectric layer.

For example, in the method for manufacturing the TFT according to one embodiment of the invention, forming the first photoresist pattern includes: forming a photoresist film, performing exposure and development on the photoresist film via a multi-tone mask, and forming the first photoresist pattern, the first photoresist pattern including a photoresist-completely-retained region and photoresist-partially-retained regions; the photoresist-completely-retained region corresponding to the area, at which the channel region is to be formed, in the pattern of the semiconductor layer; and the photoresist-partially-retained regions corresponding to the areas, at which the source lightly doped region and the drain lightly doped region are to be formed, in the pattern of the semiconductor layer.

For example, in the method for manufacturing the TFT according to one embodiment of the invention, the multi-tone mask includes any one of a half-tone mask and a gray-tone mask.

For example, the method for manufacturing the TFT according to one embodiment of the invention further comprises forming a pattern of a gate electrode, wherein the pattern of the gate electrode is formed before forming of the pattern of the semiconductor layer.

For example, the method for manufacturing the TFT according to one embodiment of the invention further comprises forming a buffer layer, wherein the buffer layer is disposed between the pattern of the gate electrode and the pattern of the semiconductor layer.

For example, in the method for manufacturing the TFT according to one embodiment of the invention, the material of the semiconductor layer includes polycrystalline silicon (poly-Si).

For example, in the method for manufacturing the TFT according to one embodiment of the invention, n-type doping is performed in the heavily doped ion implantation process and the lightly doped ion implantation process.

For example, in the method for manufacturing the TFT according to one embodiment of the invention, doped ions are phosphorus ions.

At least one embodiment of the invention further provides a method for manufacturing an array substrate, comprising the method for manufacturing the TFT as mentioned above.

At least one embodiment of the invention further provides an array substrate, manufactured by the method as mentioned above.

At least one embodiment of the invention further provides a display device, comprising the array substrate as mentioned above.

For example, in the display device according to one embodiment of the invention, the display device comprises a liquid crystal display (LCD) device or an organic light-emitting diode (OLED) display device.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

Figure 1A:
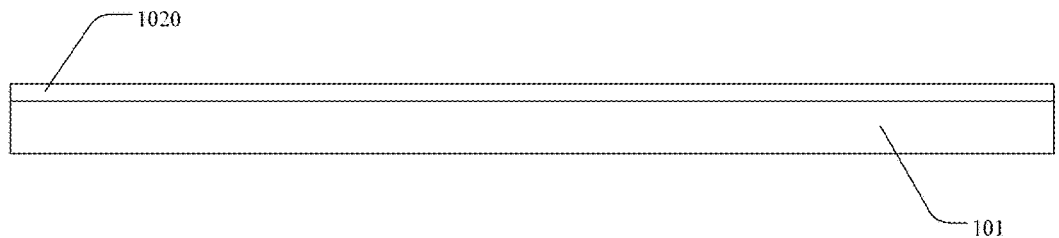
FIGS. 1a to 1h are flow diagrams of processes for forming a pattern of a gate electrode, a buffer layer, and a pattern of a semiconductor layer in a method for manufacturing a TFT, provided by one embodiment of the present invention.

Reference numerals of the accompanying drawings:
101—base substrate; 1020—gate metal film; 1021—photoresist pattern; 102—gate electrode; 122—gate electrode; 103—buffer layer; 1040—semiconductor film; 1041—photoresist pattern; 1042—a-Si Film; 1043—a-Si film of p-type TFT; 1243—a-Si film of n-type TFT; 104—semiconductor layer of p-type TFT; 124—semiconductor layer of n-type TFT; 105—photoresist pattern; 106—source of p-type TFT; 126—source heavily doped region; 107—drain of p-type TFT; 127—drain heavily doped region; 108—channel region of p-type TFT; 128—channel region of n-type TFT; 111—first photoresist pattern; 112—second photoresist pattern; 129—source lightly doped region; 120—drain lightly doped region; 1296—source of n-type TFT; 1207—drain of n-type TFT; 131—interlayer dielectric layer; 132—planarization layer; 133—common electrode; 134—insulating layer; 135—pixel electrode; 136—source/drain contact area or source/drain contact part.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Unless otherwise specified, the technical terms or scientific terms used in the disclosure have normal meanings understood by those skilled in the art. The words "first", "second" and the like used in the disclosure do not indicate the sequence, the number or the importance but are only used for distinguishing different components. Similarly, the words "a", "an", "the" and the like also do not indicate the number but only indicate at least one. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The words "on", "beneath", "left", "right" and the like only indicate the relative position relationship which is correspondingly changed when the absolute position of a described object is changed.

At least one embodiment of the present invention provides a method for manufacturing a TFT, which comprises:
forming a pattern of a semiconductor layer on a base substrate;
forming a first photoresist pattern on the pattern of the semiconductor layer, in which the first photoresist pattern includes first-thickness photoresist and second-thickness photoresist; the first-thickness photoresist corresponds to an area, at which a channel region (the channel region may correspond to an active layer of the TFT) is to be formed, in the pattern of the semiconductor layer; the second-thickness photoresist corresponds to areas, at which a source lightly doped region and a drain lightly doped region are to be formed, in the pattern of the semiconductor layer; the thickness of the first-thickness photoresist is greater than that of the second-thickness photoresist;

performing heavily doped ion implantation on the pattern of the semiconductor layer by taking the first photoresist pattern as a barrier mask, and forming patterns of a source heavily doped region and a drain heavily doped region;

performing ashing treatment on the first photoresist pattern, so as to remove the second-thickness photoresist and reduce the thickness of the first-thickness photoresist, and forming a second photoresist pattern;

performing lightly doped ion implantation on the pattern of the semiconductor layer by taking the second photoresist pattern as a barrier mask, and forming patterns of the channel region (the channel region may correspond to the active region of the TFT), the source lightly doped region and the drain lightly doped region; and removing the second photoresist pattern.

The source/drain lightly doped regions are intended to provide buffer areas for electron motion, and are a key factor for inhibiting leakage current of an N-type TFT in a pixel region. The method for manufacturing the TFT, provided by the embodiment of the present invention, adopts the first photoresist pattern, including two kinds of photoresist with different thicknesses, as the barrier mask of heavy doping process, adopts the second photoresist pattern, formed by photoresist ash ing process, as the barrier mask of light doping process, not only can simply, accurately and highly efficiently control the critical dimension of various regions (for instance, the source/drain lightly doped regions and/or the source/drain heavily doped regions) of the TFT and improve the product uniformity, but also can simplify the processing steps and reduce the cost.

Further description will be given below with reference to several embodiments.

First Embodiment

The embodiment provides a method for manufacturing a TFT. FIGS. 1a to 1h and FIGS. 2a to 2f are flow diagrams of processes in the method for manufacturing the TFT provided by the embodiment.

As illustrated in FIG. 1a, firstly, a base substrate 101 is provided. For instance, the base substrate 101 may be a glass substrate, a quartz substrate or other substrates. Secondly, a gate metal film 1020 is formed on the base substrate 101. For instance, the gate metal film 1020 may be formed by chemical vapor deposition (CVD), magnetron sputtering or vacuum evaporation. For instance, the materials of the gate metal film 1020 include but not limited to one or more selected from the group consisting of aluminum, titanium, tantalum, chromium, molybdenum and molybdenum-tungsten, or one or more selected from alloys randomly formed by the above metals. For instance, the gate metal film may be a single-layer or multi-layer structure. Correspondingly, a formed gate electrode may be a single-layer or multi-layer structure.

Figure 1B:
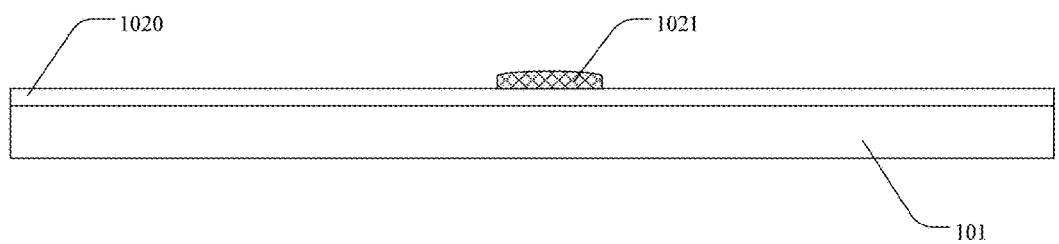

As illustrated in FIG. 1b, a photoresist pattern 1021 is formed at a corresponding position, at which a gate electrode 122 is to be formed, on the gate metal film 1020.

Figure 1C:
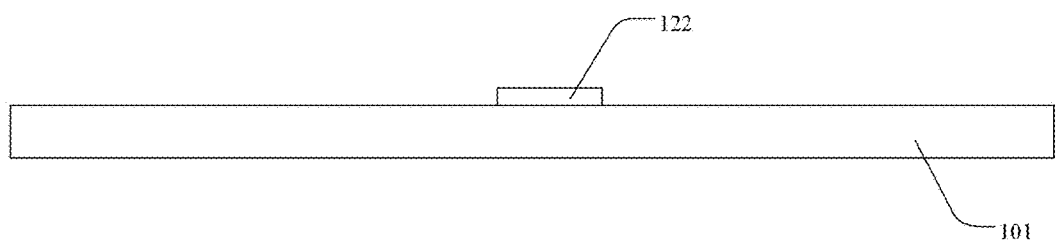

As illustrated in FIG. 1c, the gate metal film 1020 is etched by adoption of the photoresist pattern 1021 as a mask; a pattern of the gate electrode 122 is formed; and the photoresist pattern 1021 is stripped off.

Figure 1D:
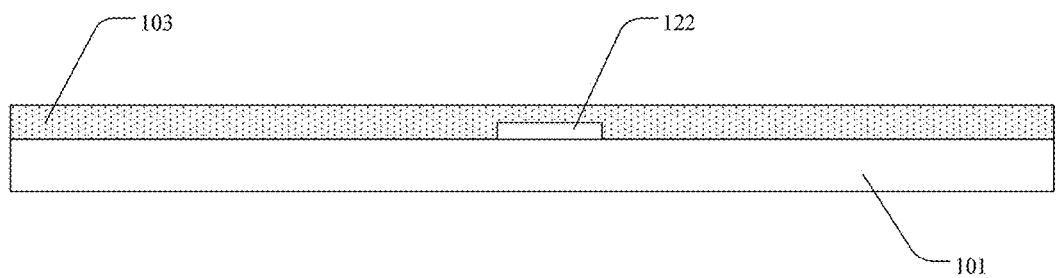

As illustrated in FIG. 1d, a buffer layer 103 is formed on the base substrate 101 and the gate electrode 122. For instance, the buffer layer 103 may be formed by CVD, but the embodiment is not limited thereto. For instance, the material of the buffer layer 103 includes but not limited to one or more selected from the group consisting of silicon nitride (SiNx), silicon oxide (SiOx) and silicon oxynitride (SiNxOy).

It should be noted that: in the embodiment, the buffer layer 103 not only has the function of shielding the defects on the base substrate 101 and avoiding the defects caused by the base substrate 101, but also can be taken as a gate insulating layer of the gate electrode 122, so the embodiment can reduce the process of forming the gate insulating layer, shorten the production time, reduce the product cost and improve the product quality.

Figure 1E:
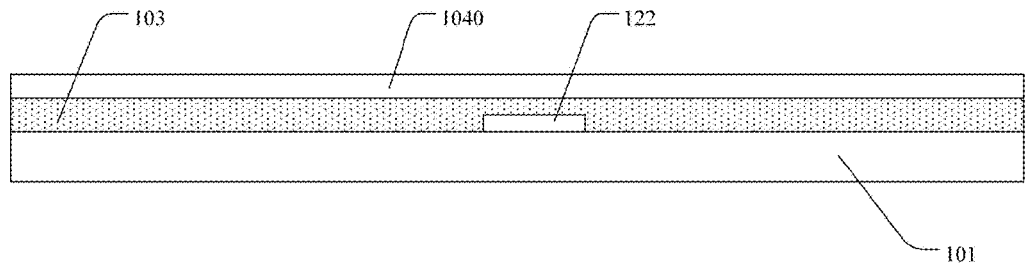

For instance, as illustrated in FIG. 1e, a semiconductor film 1040 is formed on the base substrate. For instance, the semiconductor film is made from poly-Si. The forming process of the semiconductor layer may include the following steps: firstly, forming an amorphous (a-Si) film on the buffer layer 103. For instance, the a-Si film may be formed by plasma enhanced chemical vapor deposition (PECVD). Secondly, performing laser annealing process on the a-Si film, and converting a-Si into poly-Si. For instance, the laser annealing process may adopt excimer laser annealing (ELA).

Figure 1F:
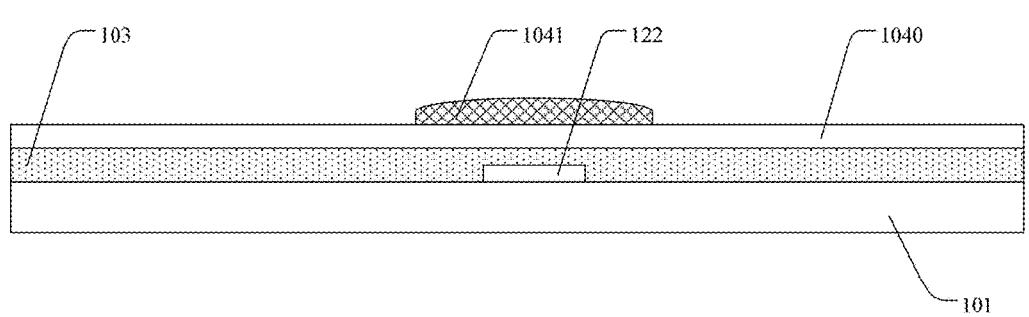

As illustrated in FIG. 1f, a photoresist pattern 1041 is formed at a corresponding position, at which a semiconductor layer 124 is to be formed, on the semiconductor film 1040.

Figure 1G:
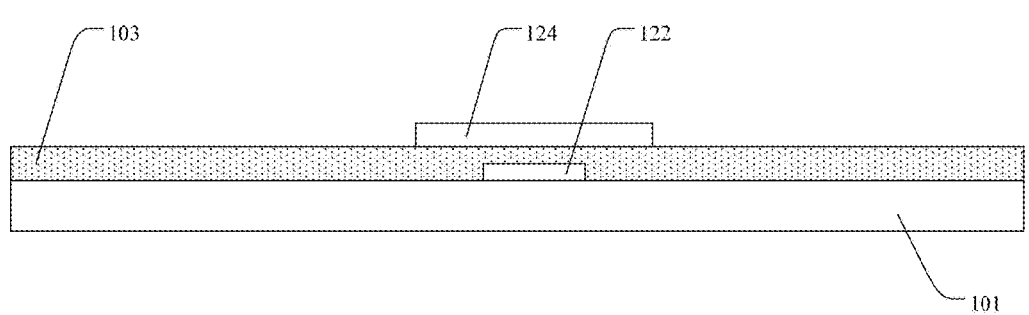

As illustrated in FIG. 1g, the semiconductor film 1040 is etched by adoption of the photoresist pattern 1041 as a mask; a pattern of the island-shaped semiconductor layer 124 is obtained; and the photoresist pattern 1041 is stripped off. For instance, the pattern of the semiconductor layer 124 is poly-Si.

Figure 1H:
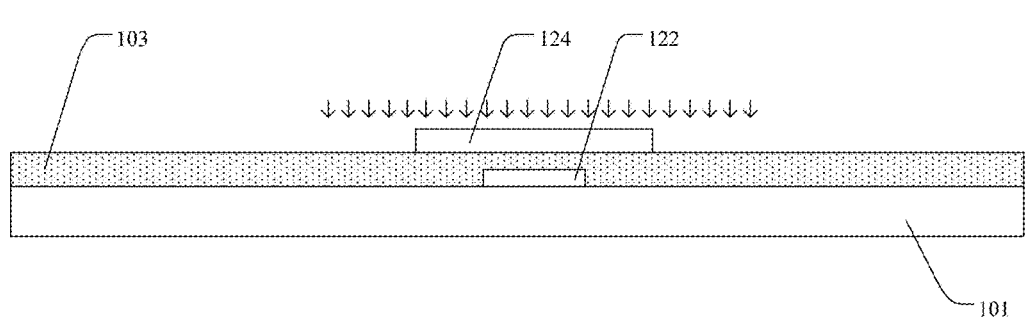

As illustrated in FIG. 1h, the pattern of the semiconductor layer 124 is subjected to threshold voltage (Vth) adjustment by doping process. For instance, the doping process of threshold voltage adjustment may be boron ion or phosphorus ion implantation doping process on the semiconductor layer 124.

Figure 2A:
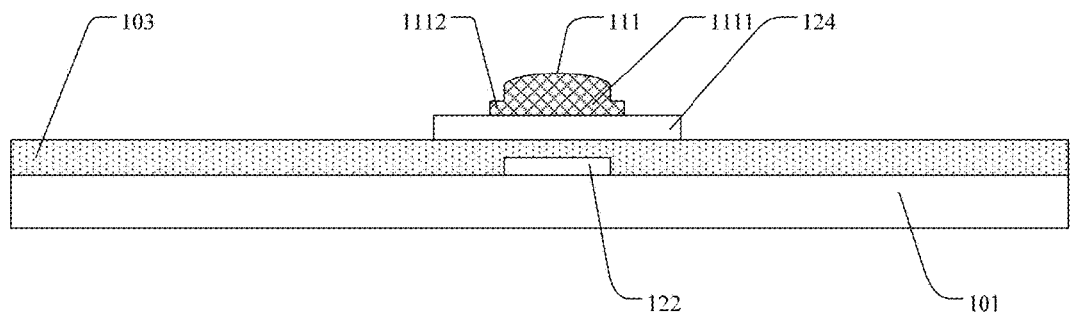
FIGS. 2a to 2f are flow diagrams of processes for forming patterns of source/drain heavily doped regions, source/drain lightly doped regions and a channel region in the pattern of the semiconductor layer in the method for manufacturing the TFT, provided by one embodiment of the present invention.

As illustrated in FIG. 2a, a first photoresist pattern 111 is formed on the pattern of the semiconductor layer 124. The first photoresist pattern 111 includes first-thickness photoresist 1111 and second-thickness photoresist 1112; the first-thickness photoresist 1111 corresponds to an area, at which a channel region 128 (not shown in the figure, please refer to FIG. 2d) is to be formed, in the pattern of the semiconductor layer 124; and the second-thickness photoresist 1112 corresponds to areas, at which a source lightly doped region 129 (not shown in the figure, please refer to FIG. 2d) and a drain lightly doped region 120 (not shown in the figure, please refer to FIG. 2d) are to be formed, in the pattern of the semiconductor layer 124. Moreover, the thickness of the first-thickness photoresist 1111 is greater than that of the second-thickness photoresist 1112. For instance, the second-thickness photoresist is disposed on both sides of the first-thickness photoresist.

For instance, the step of forming the first photoresist pattern 111 includes: forming a photoresist film on the pattern of the semiconductor layer 124, performing exposure and development on the photoresist film via a multi-tone mask, and forming the first photoresist pattern 111. The first photoresist pattern 111 includes a photoresist-completely-retained region and photoresist-partially-retained regions; the photoresist-completely-retained region corresponds to the area, at which the channel region 128 is to be formed, in the semiconductor layer 124; and the photoresist-partially-retained regions correspond to the areas, at which the source lightly doped region 129 and the drain lightly doped region 120 are to be formed, in the semiconductor layer 124. Areas on the pattern of the semiconductor layer 124, except the first photoresist pattern 111, correspond to patterns of a source heavily doped region 126 and a drain heavily doped region 127 to be formed. For instance, the drain heavily doped region may have the function of ohmic contact.

For instance, the multi-tone mask includes any one of a half-tone mask and a gray-tone mask.

Figure 2B:
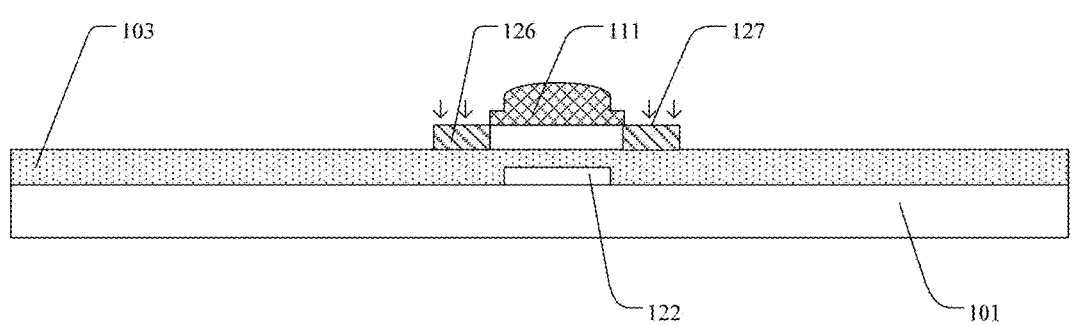

As illustrated in FIG. 2*b*, n-type heavily doped ion implantation process is performed on the pattern of the semiconductor layer 124 by adoption of the first photoresist pattern 111 as a barrier mask, and patterns of the source heavily doped region 126 and the drain heavily doped region 127 disposed on both sides are formed. For instance, injected ions may include but not limited to phosphorus ions.

Figure 2C:
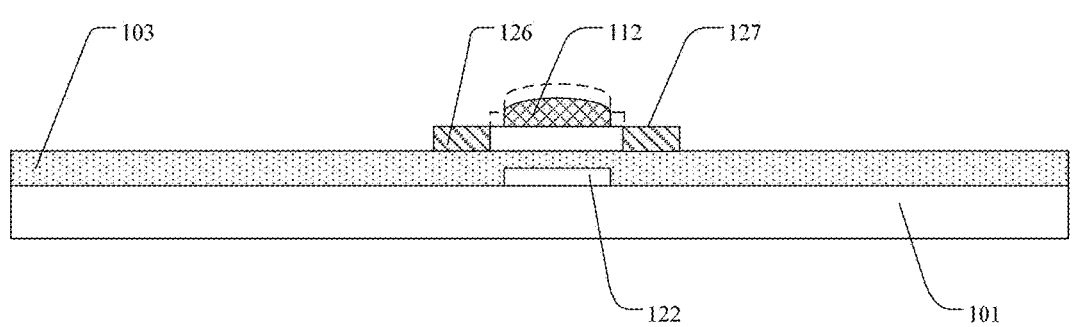

As illustrated in FIG. 2*c*, the first photoresist pattern 111 is subjected to ashing treatment by photoresist ashing process, so as to remove the second-thickness photoresist 1112 and reduce the thickness of the first-thickness photoresist 1111, and a second photoresist pattern 112 is obtained. The second photoresist pattern 112 includes the area, at which the channel region 128 is to be formed, in the pattern of the semiconductor layer 124. It should be noted that: a surface of the first photoresist pattern 111 is carbonized after n-type heavily doped ion implantation, and carbonized photoresist must be removed in the above ashing process, so as to avoid the case that the carbonized photoresist cannot be easily stripped off in the subsequent stripping process.

Figure 2D:
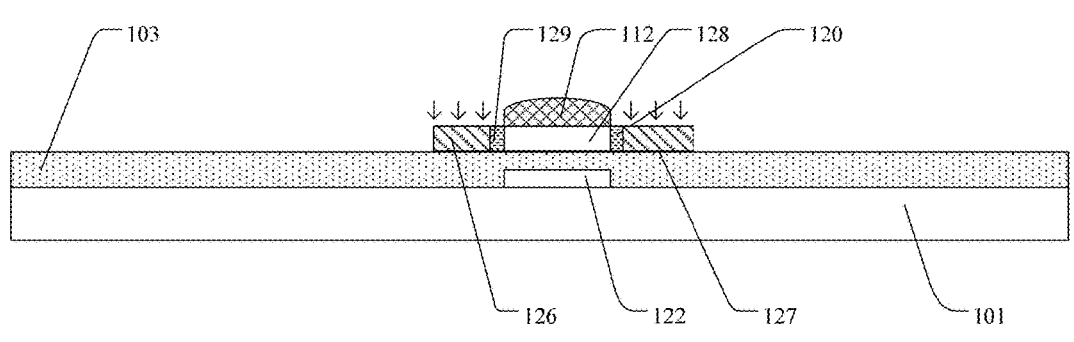

As illustrated in FIG. 2*d*, n-type lightly doped ion implantation is performed on the pattern of the semiconductor layer 124 by adoption of the second photoresist pattern 112 as a barrier mask, and a pattern of the source lightly doped region 129, a pattern of the drain lightly doped region 120, and the channel region 128 disposed between the source lightly doped region 129 and the drain lightly doped region 120 are formed. For instance, injected ions may include but not limited to phosphorus ions.

It should be noted that: as the second photoresist pattern taken as the barrier mask for forming the source/drain lightly doped regions is formed by the ashing of the first photoresist pattern 111, an additional process of forming a barrier layer is not required. For instance, the steps such as film forming, exposure and development of forming the barrier layer can be saved, or the steps such as film forming, exposure, development and etching of forming the barrier layer can be saved. Thus, the processing steps can be simplified; the production time can be shortened; and the cost can be reduced. In addition, as the first photoresist pattern 111 is directly adopted as the barrier mask, the accuracy and the uniformity of the critical dimension of the areas required for doping, namely the source heavily doped region 126 and the drain heavily doped region 127, are better than the conventional technologies, so that the quality of products can be improved.

Figure 2E:
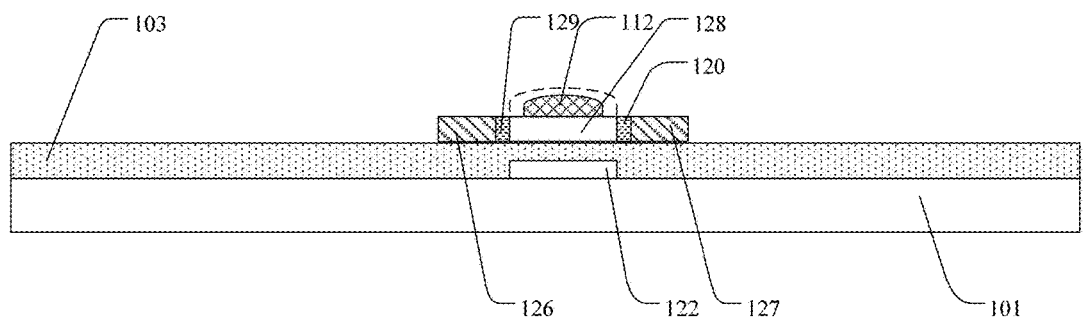

As illustrated in FIG. 2*e*, a surface of the second photoresist pattern 112 subjected to n-type lightly doped ion implantation is carbonized, and carbonized photoresist is removed by photoresist ashing process.

It should be noted that: as the surface of the second photoresist pattern 112 is carbonized after n-type lightly doped ion implantation and cannot be easily stripped off, the carbonized photoresist must be removed by photoresist ashing process. For instance, photoresist may be stripped off after the carbonized photoresist is removed.

Figure 2F:
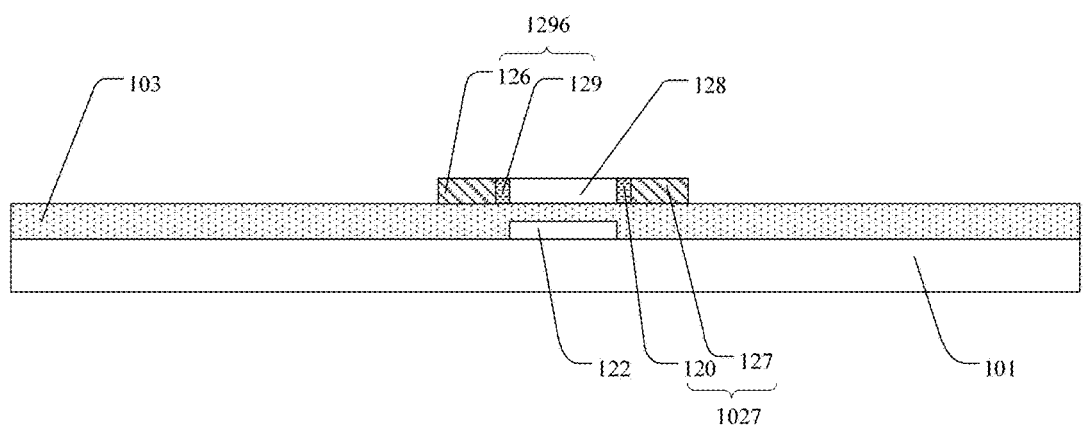

As illustrated in FIG. 2*f*, the second photoresist pattern 112 is removed. For instance, the second photoresist pattern 112 is stripped off by photoresist stripping process.

For instance, as shown in FIG. 2*f*, a source 1296 of the TFT is formed by the source lightly doped region 129 and the source heavily doped region 126; a drain 1207 of the TFT is formed by the drain lightly doped region 120 and the drain heavily doped region 127; and an interval is disposed between the source 1296 and the drain 1207 to define the channel region 128.

For instance, as shown in FIG. 2*f*, the source lightly doped region 129 and the drain lightly doped region 120 are respectively disposed on both sides of the channel region 128, and the source heavily doped region 126 and the drain heavily doped region 127 are respectively disposed on the outside of the source lightly doped region 129 and the drain lightly doped region 120.

In the method for manufacturing the TFT, provided by the embodiment, as the first photoresist pattern including two kinds of photoresist with different thicknesses is formed and taken as the barrier mask of heavy doping process, and the second photoresist pattern 112 obtained after the ashing of the first photoresist pattern 111 is directly taken as the barrier mask to perform n-type lightly doped ion implantation, an additional barrier layer may be not required. Thus, the processing steps can be simplified; the production time can be shortened; and the cost can be reduced. In addition, as the photoresist is directly taken as the barrier mask, the accuracy and the uniformity of the critical dimension of the source heavily doped region 126, the drain heavily doped region 127, the source lightly doped region 129 and the drain lightly doped region 120, formed in the n-type heavily doped ion implantation process and the n-type lightly doped ion implantation process, are better than the prior art, so that the quality of products can be improved.

Second Embodiment

The embodiment provides a method for manufacturing a TFT. FIGS. 3*a* to 3*i*, FIGS. 4*a* to 4*d* and FIGS. 5*a* to 5*f* are flow diagrams of processes in the method for manufacturing the TFT provided by the embodiment.

Figure 3A:
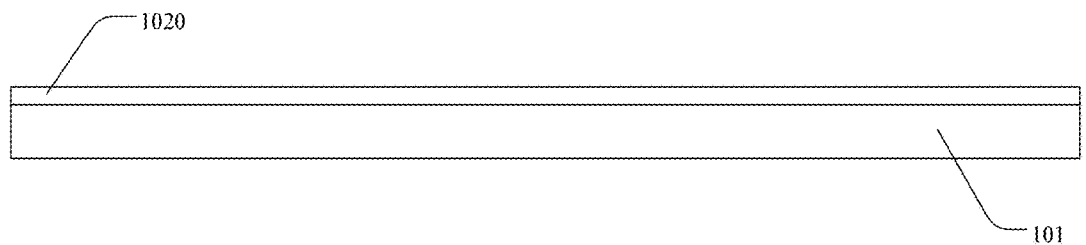
FIGS. 3a to 3i are flow diagrams of processes for forming patterns of gate electrodes of a p-type TFT and an n-type TFT, a buffer layer, a pattern of a semiconductor layer, and an interlayer dielectric layer on a base substrate, in the method provided by one embodiment of the present invention.

As illustrated in FIG. 3*a*, a base substrate 101 is provided. For instance, the base substrate 101 may be a glass substrate, a quartz substrate or other substrates. Secondly, a gate metal film 1020 is formed on the base substrate 101. For instance, the gate metal film 1020 may be formed by CVD, magnetron sputtering or vacuum evaporation, but the embodiment is not limited thereto. The materials of the gate metal film 1020 include but not limited to one or more selected from the group consisting of aluminum, titanium, tantalum, chromium, molybdenum and molybdenum-tungsten, or one or more selected from alloys randomly formed by the above metals.

Figure 3B:
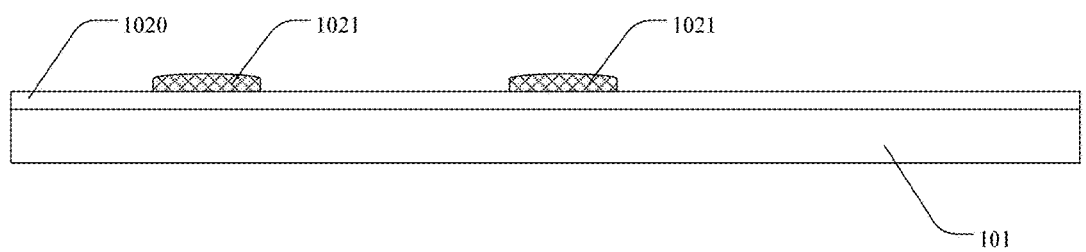

As illustrated in FIG. 3*b*, photoresist patterns 1021 are formed at corresponding positions, at which a gate electrode 102 of a p-type TFT and a gate electrode 122 of an n-type TFT are to be formed, on the gate metal film 1020.

Figure 3C:
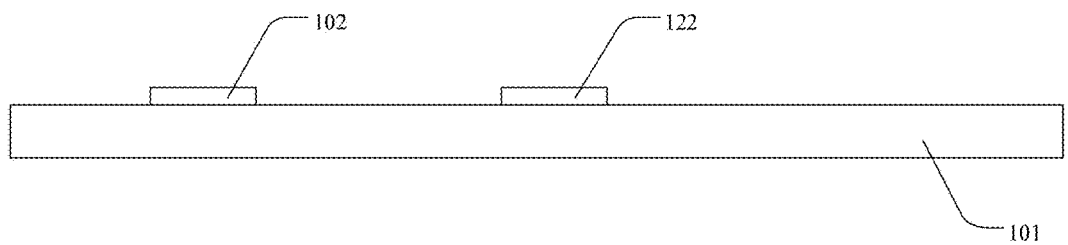

As illustrated in FIG. 3*c*, the gate metal film 1020 is etched by adoption of the photoresist patterns 1021 as a mask; patterns of the gate electrode 102 of the p-type TFT and the gate electrode 122 of the n-type TFT are formed; and the photoresist patterns 1021 are stripped off.

Figure 3D:
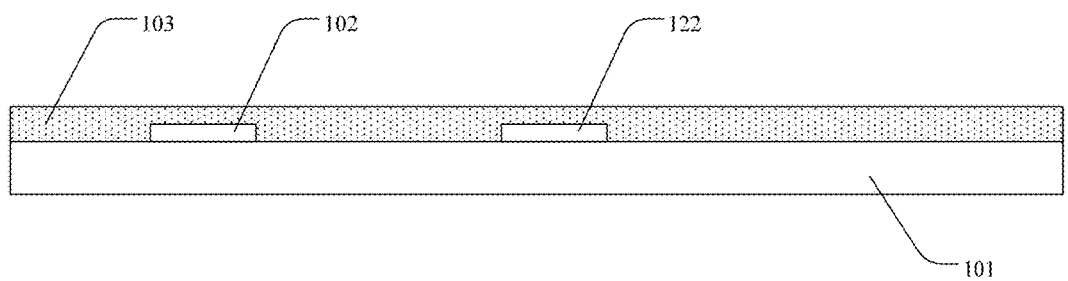

As illustrated in FIG. 3*d*, a buffer layer 103 is formed on the base substrate 101, the gate electrode 102 and the gate electrode 122. For instance, the buffer layer 103 may be formed by CVD, but the embodiment is not limited thereto.

For instance, the material of the buffer layer 103 includes but not limited to one or more selected from the group consisting of SiNx, SiOx and SiNxOy.

It should be noted that: in the embodiment, the buffer layer 103 not only has the function of shielding the defects on the base substrate 101 and avoiding the defects caused by the base substrate 101, but also can be taken as a gate insulating layer of the gate electrode 102 and the gate electrode 122, so the embodiment can reduce the process of forming the gate insulating layer, shorten the production time, reduce the product cost and improve the product quality.

Figure 3E:
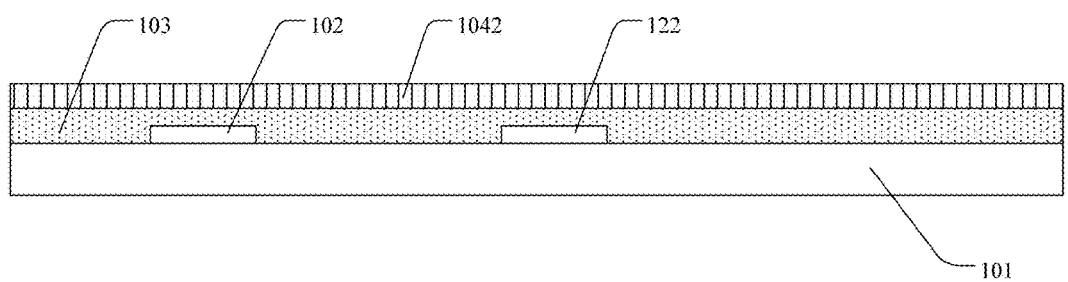

For instance, as illustrated in FIG. 3e, an a-Si film 1042 is formed on the base substrate. For instance, the a-Si film may be formed by PECVD, but the embodiment is not limited thereto.

Figure 3F:
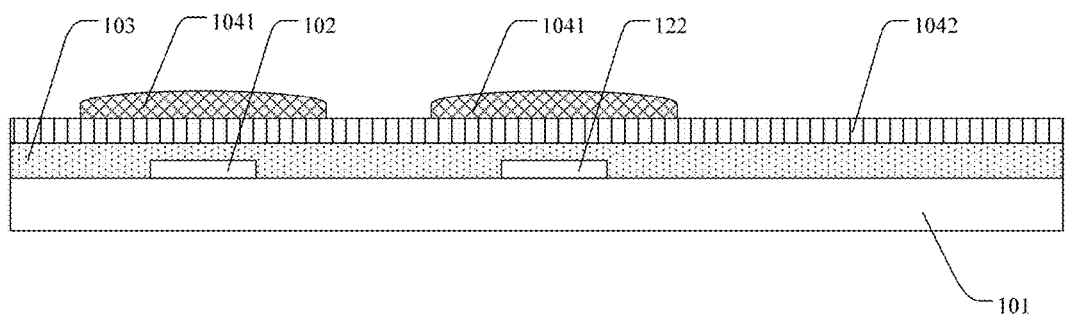

As illustrated in FIG. 3f, semiconductor layer photoresist patterns 1041 are formed at corresponding positions, at which a semiconductor layer 104 of the p-type TFT and a semiconductor layer 124 of the n-type TFT are to be formed, on the a-Si film 1042.

Figure 3G:
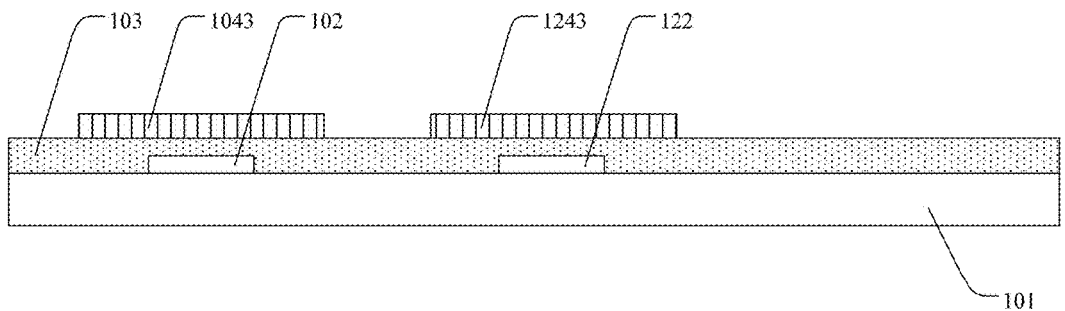

As illustrated in FIG. 3g, the a-Si film 1042 is etched by adoption of the semiconductor layer photoresist patterns 1041 as a mask, so as to remove the a-Si film not covered by photoresist; patterns of island-shaped a-Si layers 1043 and 1243 are obtained; and the semiconductor layer photoresist patterns 1041 are stripped off.

Figure 3H:
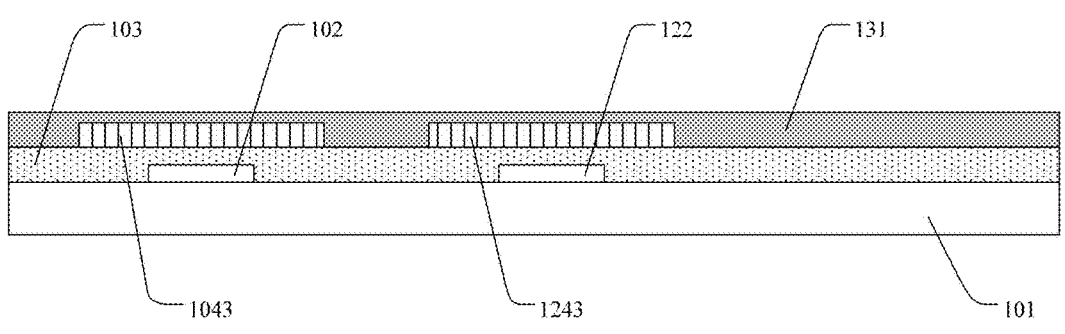

As illustrated in FIG. 3h, an interlayer dielectric layer 131 is formed on the patterns of the a-Si layers 1043 and 1243 and the buffer layer 103.

Figure 3I:
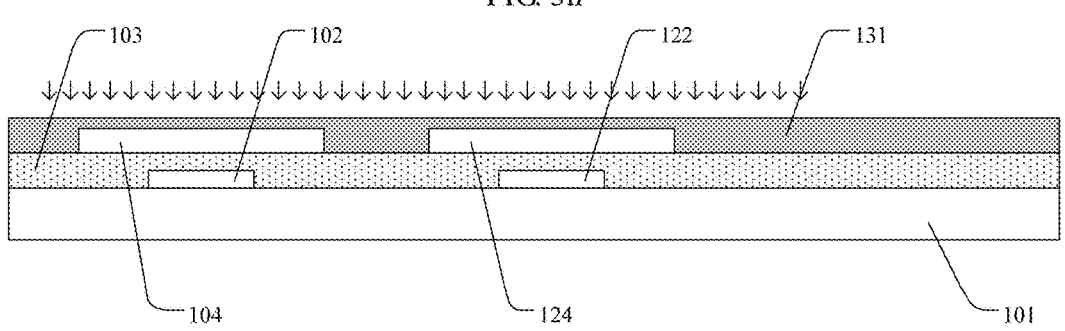

As illustrated in FIG. 3i, the patterns of the a-Si layers are subjected to ELA process to convert a-Si into poly-Si, and patterns (poly-Si patterns) of the semiconductor layers 104 and 124 are formed. Subsequently, the patterns of the semiconductor layers 104 and 124 are subjected to threshold voltage adjustment. The formed interlayer dielectric layer can protect the a-Si layers to a certain degree during laser annealing. It should be noted that the case may also be that: the patterns of the a-Si layers are subjected to ELA process to convert a-Si into poly-Si; and then, the obtained products are patterned to form the semiconductor layer patterns (poly-Si patterns); and then, threshold voltage adjustment is performed; and then, the interlayer dielectric layer is formed. No limitation will be given here. For instance, the patterns of the semiconductor layers 104 and 124 may be subjected to threshold voltage adjustment by doping process. The doping process of threshold voltage adjustment may be adopted to perform boron ion or phosphorus ion implantation doping on the patterns of the semiconductor layers 104 and 124.

Figure 4A:
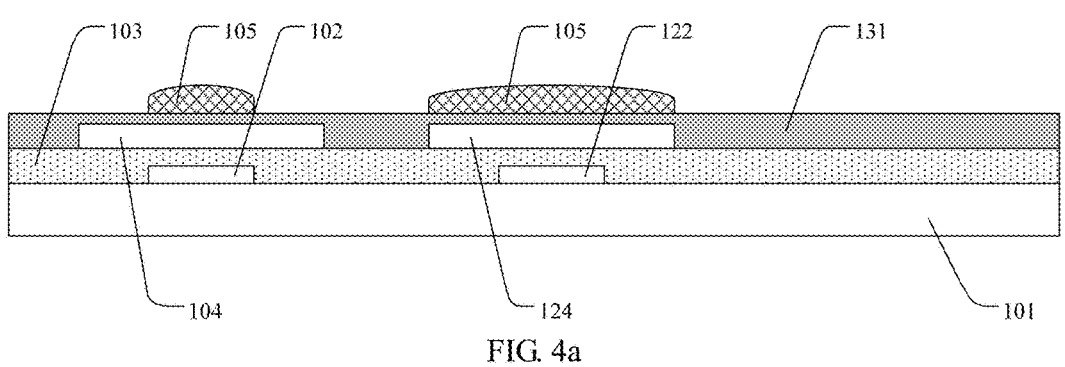
FIGS. 4a to 4d are flow diagrams of processes for forming patterns of source/drains and a channel region in the pattern of the semiconductor layer of the p-type TFT, in the method provided by one embodiment of the present invention.

As illustrated in FIG. 4a, photoresist patterns 105 for defining source/drains of the p-type TFT to be formed are formed on the interlayer dielectric layer 131. The photoresist patterns 105 include a portion formed over the pattern of the semiconductor layer 104 of the p-type TFT to be formed, in which the portion only covers a part, on which the channel region 108 (not shown in the figure, please refer to FIG. 4b) is to be formed, in the pattern of the semiconductor layer 104; and a portion formed over the semiconductor layer 124 of the n-type TFT to be formed, in which the portion covers the pattern of the entire semiconductor layer 124.

It should be noted that the portion, covering the pattern of the semiconductor layer 124, in the photoresist pattern 105 is used for protecting the semiconductor layer 124 from being affected by the subsequent p-type doping ion implantation process.

Figure 4B:
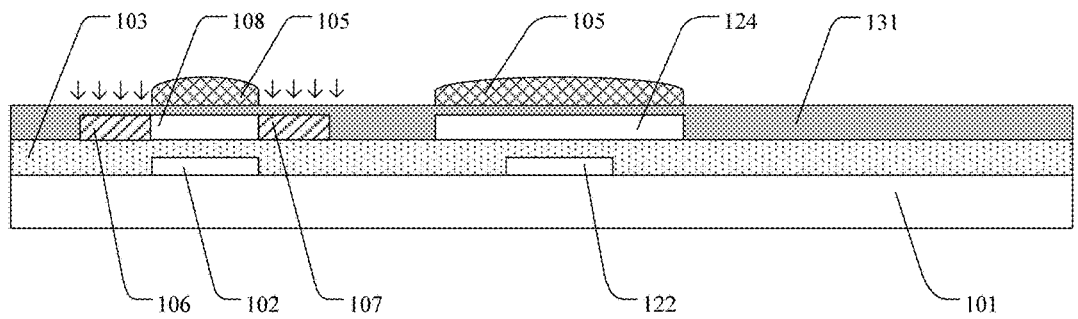

As illustrated in FIG. 4b, p-type doping ion implantation process is performed by adoption of the photoresist patterns 105 as a barrier mask, and a source 106, a drain 107 and the channel region 108 disposed between the source 106 and the drain 107 are formed in the semiconductor layer 104. For instance, an interval is formed between the source 106 and the drain 107 to define the channel region 108. For instance, injected ions may be boron ions. For instance, the p-type doping is p-type heavy doping.

It should be noted that: as the photoresist patterns 105 are directly adopted as the mask, the accuracy and the uniformity of the critical dimension of areas required for doping, namely the source 106 and the drain 107, are better than the conventional technologies, so that the quality of products can be improved. Thus, the etching process can be reduced; the productivity can be improved; the cost can be saved; and meanwhile, the time of manufacturing the entire product can be reduced, so as to avoid the addition of defects caused by the increase of the time.

Figure 4C:
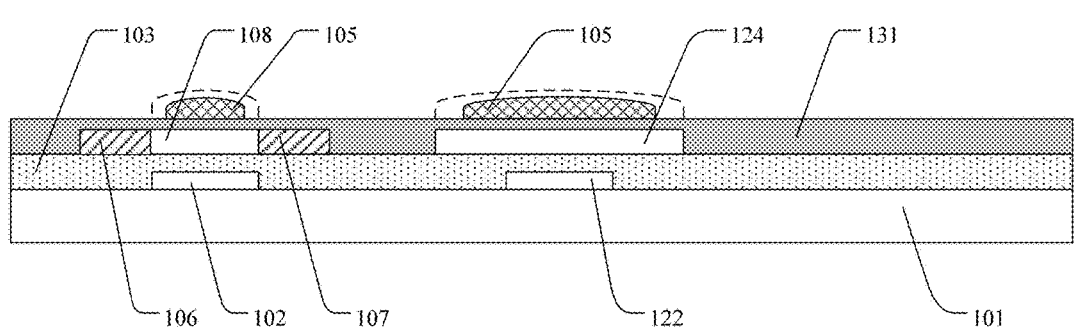

As illustrated in FIG. 4c, surfaces of the photoresist patterns 105 subjected to p-type doping ion implantation process are carbonized; carbonized photoresist is removed by photoresist ashing process; and subsequently, photoresist is stripped off.

It should be noted that: as the surfaces of the photoresist patterns 105 are carbonized after p-type doping ion implantation process and cannot be easily stripped off, the carbonized photoresist can be removed by photoresist ashing process.

Figure 4D:
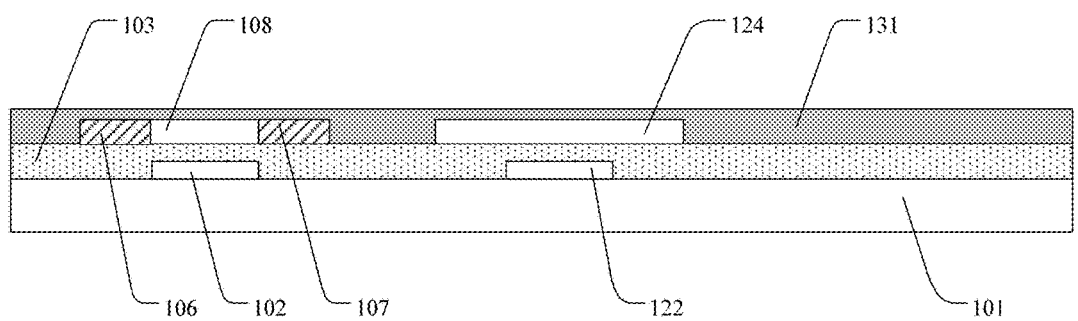

As illustrated in FIG. 4d, the remaining photoresist patterns 105 are stripped off, and the p-type TFT is formed by the gate electrode 102, the buffer layer 103, the source 106, the drain 107 and the channel region 108.

Figure 5A:
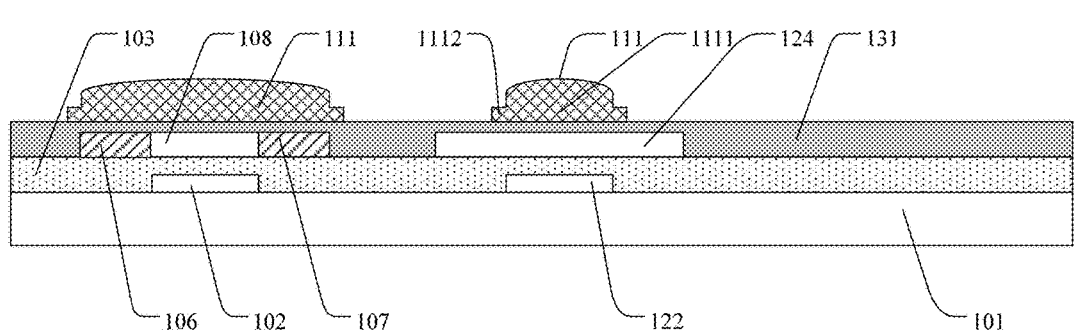
FIGS. 5a to 5f are flow diagrams of processes for forming patterns of source/drain heavily doped regions, source/drain lightly doped regions and a channel region in the pattern of the semiconductor layer of the n-type TFT, in the method provided by one embodiment of the present invention.

As illustrated in FIG. 5a, first photoresist patterns 111 are formed on the interlayer dielectric layer 131. The first photoresist patterns 111 include a part for covering a pattern of the semiconductor layer 124 of the n-type TFT to be formed. The part includes first-thickness photoresist 1111 and second-thickness photoresist 1112; the first-thickness photoresist 1111 corresponds to an area, at which a pattern of a channel region 128 (not shown in the figure, please refer to FIG. 5f) is to be formed, in the pattern of the semiconductor layer 124; and the second-thickness photoresist 1112 corresponds to areas, at which a source lightly doped region 129 and a drain lightly doped region 120 are to be formed, in the pattern of the semiconductor layer 124. Moreover, the thickness of the first-thickness photoresist 1111 is greater than that of the second-thickness photoresist 1112. The first photoresist patterns 111 further include a part for covering the source 106, the drain 107 and the channel region 108 of the p-type TFT. The part completely covers the source 106, the drain 107 and the channel region 108 of the p-type TFT, and the width of the part is greater than the total width of the source 106, the drain 107 and the channel region 108 (the semiconductor layer 104).

For instance, the step of forming the first photoresist patterns 111 includes: forming a photoresist film on the patterns of the semiconductor layers 104 and 124; performing exposure and development on the photoresist film via a multi-tone mask; and forming the first photoresist patterns 111. The first photoresist patterns 111 include photoresist-completely-retained regions and photoresist-partially-retained regions; the photoresist-completely-retained regions correspond to areas provided with the source 106, the drain 107 and the channel region 108 of the p-type TFT, and an area, at which the channel region 128 is to be formed, in the pattern of the semiconductor layer 124; and the photoresistpartially-retained regions correspond to areas, at which the source lightly doped region 129 and the drain lightly doped region 120 are to be formed, in the pattern of the semiconductor layer 124. For instance, in the first photoresist pattern 111 corresponding to the pattern of the semiconductor layer 124, the second-thickness photoresist is disposed on both sides of the first-thickness photoresist.

For instance, the multi-tone mask includes any one of a half-tone mask and a gray-tone mask.

It should be noted that the part, covering the source 106, the drain 107 and the channel 108, in the first photoresist patterns 111 is used for avoiding the source 106, the drain 107 and the channel 108 from being affected by the subsequent n-type heavily doped ion implantation process.

Figure 5B:
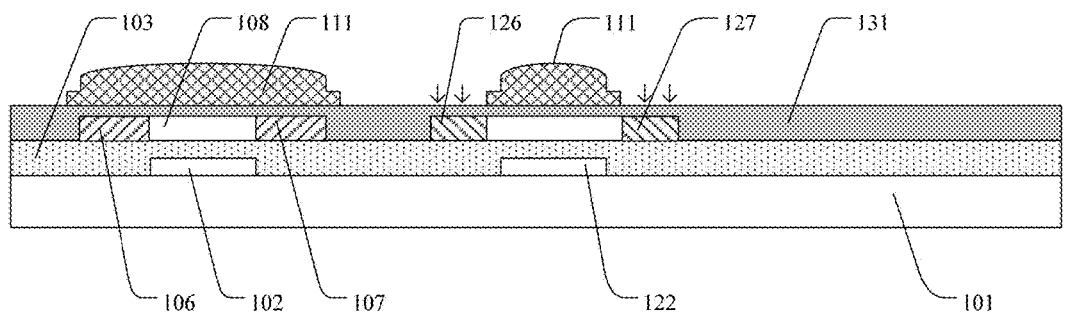

As illustrated in FIG. 5b, the pattern of the semiconductor layer 124 is subjected to n-type heavily doped ion implantation by adoption of the first photoresist pattern 111 as a barrier mask, and a source heavily doped region 126 and a drain heavily doped region 127 disposed on both sides are formed. For instance, injected ions may include but not limited to phosphorus ions.

It should be noted that: as the first photoresist pattern 111 is directly adopted as the barrier mask, the accuracy and the uniformity of the critical dimension of the areas required for doping, namely the source heavily doped region 126 and the drain heavily doped region 127, are better than the prior art, so that the quality of products can be improved.

Figure 5C:
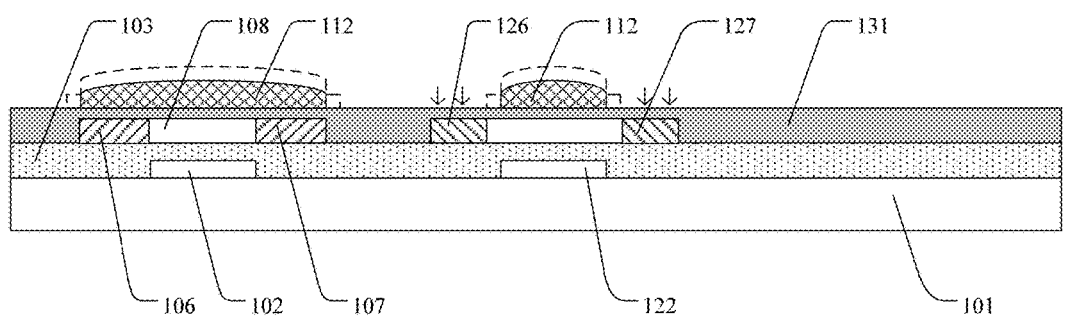

As illustrated in FIG. 5c, the first photoresist patterns 111 are subjected to ashing by photoresist ashing process, so as to remove the second-thickness photoresist 1112 and reduce the thickness of the first-thickness photoresist 1111, and second photoresist patterns 112 are obtained. The second photoresist patterns 112 include a part for covering the source 106, the drain 107 and the channel region 108 of the p-type TFT, and a part for covering a corresponding area, at which the channel region 128 is to be formed, in the pattern of the semiconductor layer 124 of the n-type TFT. Surfaces of the first photoresist patterns 111 subjected to n-type heavily doped ion implantation are carbonized. In the above ashing process, carbonized photoresist is simultaneously removed as well.

It should be noted that: as the width of the part for covering the p-type TFT in the first photoresist patterns 111 is greater than the width of the p-type TFT, the formed second photoresist pattern 112 can still completely cover the p-type TFT after the ashing process, so that the objective of protection can be achieved.

Figure 5D:
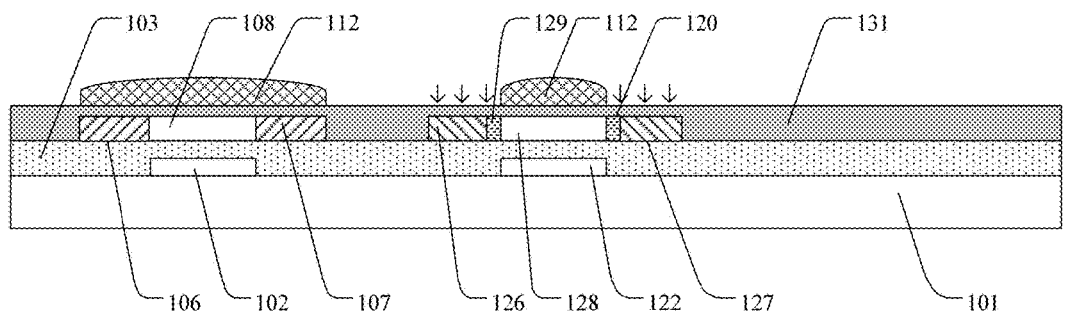

As illustrated in FIG. 5d, the pattern of the semiconductor layer 124 is subjected to n-type lightly doped ion implantation by adoption of the second photoresist pattern 112 as a barrier mask, and patterns of the source lightly doped region 129, the drain lightly doped region 120, and the channel region 128 disposed between the source lightly doped region 129 and the drain lightly doped region 120 are formed. For instance, injected ions may include but not limited to phosphorus ion.

Figure 5E:
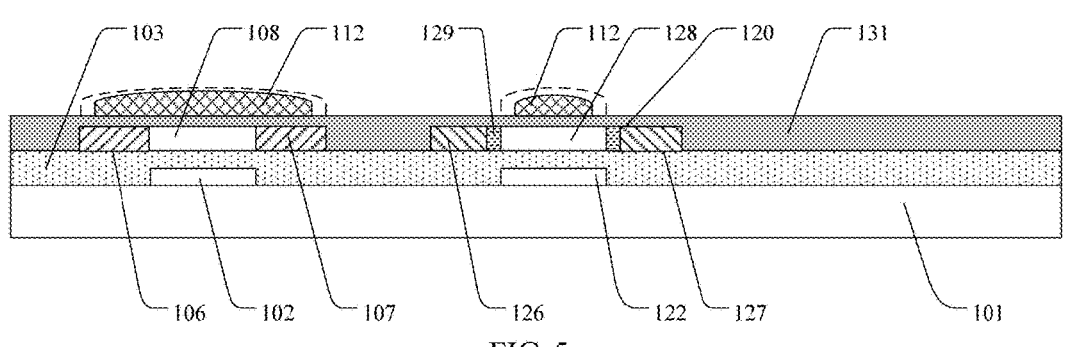

As illustrated in FIG. 5e, surfaces of the second photoresist patterns 112 subjected to n-type lightly doped ion implantation are carbonized, and carbonized photoresist is removed by photoresist ashing process.

It should be noted that: as the surfaces of the second photoresist patterns 112 are carbonized after n-type lightly doped ion implantation and cannot be easily stripped off, the carbonized photoresist can be removed by photoresist ashing process.

Figure 5F:
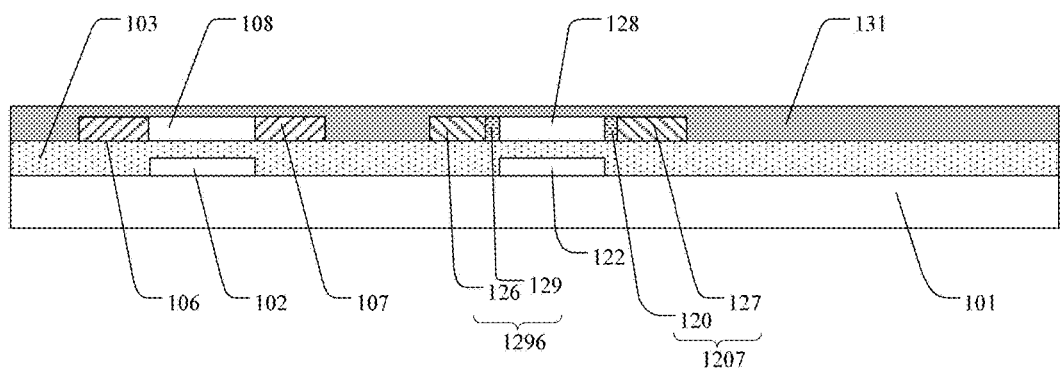

As illustrated in FIG. 5f, the remaining second photoresist patterns 112 are stripped off, so that the second photoresist patterns 112 can be removed.

It should be noted that the interlayer dielectric layer may be not arranged in the embodiment as the same with the first embodiment. Thus, the first photoresist patterns are directly formed on the pattern of the semiconductor layer.

For instance, as shown in FIG. 5f, a source 1296 of the TFT is formed by the source lightly doped region 129 and the source heavily doped region 126; a drain 1207 of the TFT is formed by the drain lightly doped region 120 and the drain heavily doped region 127; and an interval is disposed between the source 1296 and the drain 1207 to define the channel region 128.

For instance, as shown in FIG. 5f, the source lightly doped region 129 and the drain lightly doped region 120 are respectively disposed on both sides of the channel region 128, and the source heavily doped region 126 and the drain heavily doped region 127 are respectively disposed on the outside of the source lightly doped region 129 and the drain lightly doped region 120.

In the method for manufacturing the TFT, provided by the embodiment, as the first photoresist patterns including two kinds of photoresist with different thicknesses are formed and taken as the barrier mask of heavy doping process, and the second photoresist patterns 112 obtained after the ashing of the first photoresist patterns 111 are directly taken as the barrier mask to perform n-type lightly doped ion implantation process, an additional barrier layer may be not required. Thus, the processing steps can be simplified; the production time can be shortened; and the cost can be reduced. Meanwhile, the n-type TFT and the p-type TFT can be formed. Moreover, at least one time of manufacturing the photoresist patterns can be reduced by the ashing process, so the manufacturing process can be simplified. In addition, as the photoresist is directly taken as the barrier mask, the accuracy and the uniformity of the critical dimension of the source 106, the drain 107, the source heavily doped region 126, the drain heavily doped region 127, the source lightly doped region 129 and the drain lightly doped region 120, formed in the n-type heavily doped ion implantation process and the n-type lightly doped ion implantation process, are better than the conventional technologies, so that the quality of products can be improved.

Third Embodiment

Figure 6A:
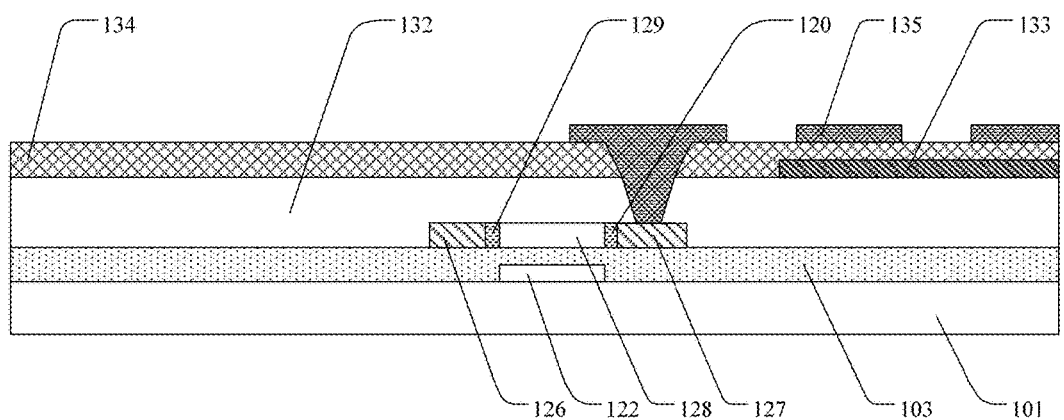
FIG. 6a is schematic sectional view of an array substrate provided by one embodiment of the present invention.

The embodiment provides a method for manufacturing an array substrate, which comprises the method for manufacturing the TFT, provided by the first embodiment. The method for manufacturing the TFT will not be further described here and refers to the above description. FIG. 6a is a schematic sectional view of an array substrate manufactured by the method for manufacturing the array substrate, provided by the embodiment.

For instance, as illustrated in FIG. 6a, the method for manufacturing the array substrate, provided by the embodiment, may further comprise: forming a planarization layer 132 on the buffer layer 103 and the n-type TFTs. Common electrodes 133 are formed at areas, corresponding to display regions, on the planarization layer 132. An insulating layer 134 is formed on the planarization layer 132 and the common electrodes 133. Through holes are formed in the insulating layer 134 and the planarization layer 132. The through holes run through the insulating layer 134 and the planarization layer 132 to expose the drain heavily doped regions 127 of the n-type TFTs. Pixel electrodes 135 are formed at areas, corresponding to the display regions, on the insulating layer 134. The pixel electrodes 135 are electrically connected with the drain heavily doped regions 127 via through holes.

Figure 6B:
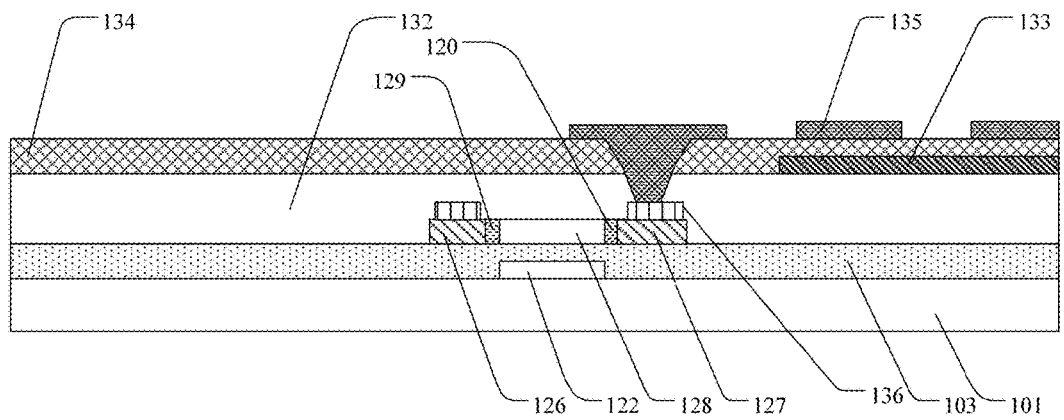
FIG. 6b is a schematic sectional view of another array substrate provided by one embodiment of the present invention.

For instance, as illustrated in FIG. 6b, the method may further comprise the step of forming source/drain contact areas 136. For instance, the source/drain contact areas 136 may be made from metallic materials, but the embodiment is not limited thereto. For instance, the source contact area may be a data line, but the embodiment is not limited thereto. For instance, the drain contact area may be a contact electrode, but the embodiment is not limited thereto.

For instance, the planarization layer 132 may be a single-layer structure or a multi-layer structure.

For instance, the material of the planarization layer 132 includes but not limited to one or more selected from the group consisting of SiNx, SiOx and SiNxOy.

For instance, the planarization layer 132 may be formed by PECVD, but the embodiment is not limited thereto.

For instance, the material of the common electrodes 133 and the pixel electrodes 135 may include but not limited to transparent metal oxide such as indium tin oxide (ITO) and indium zinc oxide (IZO).

For instance, the common electrodes 133 and the pixel electrodes 135 may be formed by magnetron sputtering, but the embodiment is not limited thereto.

It should be noted that: in the method for manufacturing the array substrate, provided by the embodiment, the forming sequence of the pixel electrodes 135 and the common electrodes 133 may be exchanged, namely the common electrodes are disposed above the pixel electrodes. No specific limitation will be given here. Electrodes disposed above are, for instance, slit electrodes.

Fourth Embodiment

Figure 7:
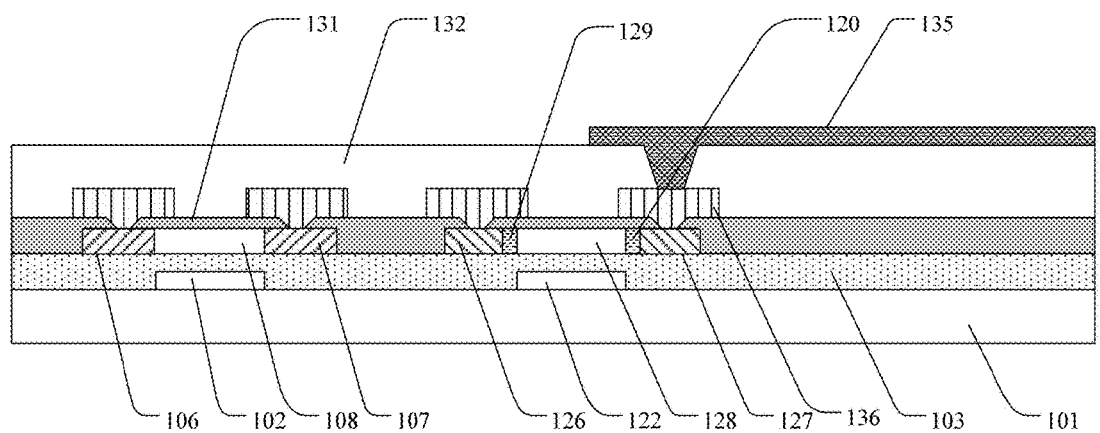
FIG. 7 is a schematic sectional view of still another array substrate provided by one embodiment of the present invention.

The embodiment provides a method for manufacturing an array substrate, which comprises the method for manufacturing the TFT, provided by the second embodiment. The method for manufacturing the TFT will not be further described here and refers to the above description. FIG. 7 illustrates an array substrate manufactured by the method for manufacturing the array substrate, provided by the embodiment of the present invention.

For instance, as illustrated in FIG. 7, the method for manufacturing the array substrate, provided by one example of the embodiment, further comprises: forming a plurality of through holes on the interlayer dielectric layer 131, in which the plurality of through holes respectively run through the interlayer dielectric layer 131 to expose the sources 106 and the drains 107 of the p-type TFTs and the source heavily doped regions 126 and the drain heavily doped regions 127 of the n-type TFTs; forming a metal layer on the interlayer dielectric layer 131 provided with the through holes, allowing the metal layer to be filled into the plurality of through holes, and forming a plurality of source/drain contact areas 136, connected with the sources 106 and the drains 107 of the p-type TFTs and the source heavily doped regions 126 and the drain heavily doped regions 127 of the n-type TFTs, by patterning processes; forming a planarization layer 132 on the interlayer dielectric layer 131 and the plurality of source/drain contact areas 136; forming through holes in the planarization layer 132, and allowing the through holes to run through the planarization layer 132 to expose the source/drain contact areas 136 connected with the drain heavily doped regions 127 of the n-type TFTs; and forming pixel electrodes 135 on the planarization layer 132, in which the pixel electrodes 135 are connected with the source/drain contact areas 136 connected with the drain heavily doped regions 127 of the n-type TFTs via through holes. For instance, the source contact area may be a data line, but the embodiment is not limited thereto. For instance, the drain contact area may be a contact electrode, but the embodiment is not limited thereto. For instance, the method for manufacturing the array substrate, provided by the example, may not comprise the step of forming the drain contact areas.

For instance, the planarization layer 132 may be a single-layer structure or a multi-layer structure.

For instance, the material of the planarization layer 132 includes but not limited to one or more selected from the group consisting of SiNx, SiOx and SiNxOy.

For instance, the planarization layer 132 may be formed by PECVD, but the embodiment is not limited thereto.

For instance, the material of the pixel electrodes 135 may be transparent metal oxide such as ITO and IZO, but the embodiment is not limited thereto.

For instance, the pixel electrodes 135 may be formed by magnetron sputtering, but the embodiment is not limited thereto.

It should be noted that the method for manufacturing the array substrate, provided by the embodiment, not only can be used for manufacturing an array substrate of an LCD device but also can be used for manufacturing an array substrate of an OLED display device. When the method for manufacturing the array substrate is used for manufacturing the array substrate of the OLED display device, the pixel electrodes 135 may be taken as anodes of the OLED display device.

In the method for manufacturing the array substrate, provided by the third embodiment and the fourth embodiment, by adoption of bottom-gate design, the gate electrodes 122 are directly formed on the base substrate 101, so that the process of forming the gate insulating layer can be reduced, and hence the production time can be shortened and the product cost can be reduced. In addition, in the method for manufacturing the array substrate, provided by the third embodiment and the fourth embodiment, photoresist with different thicknesses is formed by multi-tone mask process, and at least one time for manufacturing the photoresist pattern is reduced by ashing process, so that the manufacturing process can be simplified and the defects caused by complex manufacturing process can be reduced. Moreover, as the second photoresist pattern 112 obtained after the ashing of the first photoresist pattern 111 is directly taken as the barrier mask to perform n-type lightly doped ion implantation process, an additional barrier layer may be not required. Thus, the processing steps can be simplified; the production time can be shortened; and the cost can be reduced. In addition, as the photoresist is directly taken as the barrier mask, the accuracy and the uniformity of the critical dimension of the source 106, the drain 107, the source heavily doped region 126, the drain heavily doped region 127, the source lightly doped region 129 and the drain lightly doped region 120, formed in the p-type doping ion implantation process, the n-type heavily doped ion implantation process and the n-type lightly doped ion implantation process, are better than the conventional technologies, so that the quality of products can be improved.

Fifth Embodiment

The embodiment provides an array substrate, which is manufactured by the method for manufacturing the array substrate, provided by the third embodiment or the fourth embodiment. The array substrate provided by the embodiment has the same technical effects with the method for manufacturing the array substrate, provided by the third embodiment or the fourth embodiment. No further description will be given here.

Sixth Embodiment

The embodiment provides a display device. The display device comprises an LCD device or an OLED display device.

When the display device is an LCD device, the display device not only comprises any foregoing array substrate but also may comprise an opposing substrate and a liquid crystal layer disposed between the array substrate and the opposing substrate.

When the display device is an OLED display device, the display device comprises the array substrate manufactured by the method for manufacturing the array substrate, provided by the fourth embodiment, and cathodes, an organic emission layer and the like disposed on the array substrate. The display device provided by the embodiment of the present invention has the same technical effects with the method for manufacturing the array substrate, provided by the third embodiment or the fourth embodiment. No further description will be given here.

The following points should be noted:

(1) Those not involved in the embodiment of the present invention refer to the conventional design.

(2) Only the structures relevant to the embodiments of the present invention are involved in the accompanying drawings of the embodiments of the present invention, and other structures may refer to the prior art.

(3) For clarity, the thickness of layers or areas in the accompanying drawings of the embodiments of the present invention is enlarged. It should be understood that when an element such as a layer, a film, an area or a substrate is referred to be disposed "on" or "beneath" another element, the element may be "directly" disposed "on" or "beneath" another element, or an intermediate element may be provided.

(4) The embodiments of the present invention and the characteristics in the embodiments may be mutually combined without conflict.

The foregoing is only the preferred embodiments of the present invention and not intended to limit the scope of protection of the present invention. Any change or replacement that may be easily thought of by those skilled in the art within the technical scope disclosed by the present invention shall fall within the scope of protection of the present invention. Therefore, the scope of protection of the present invention shall be defined by the appended claims.

The application claims priority to the Chinese patent application No. 201510502027.5, filed Aug. 14, 2015, the disclosure of which is incorporated herein by reference as part of the application.

The invention claimed is:

1. A method for manufacturing a thin-film transistor (TFT), comprising:
    forming a pattern of a semiconductor layer on a base substrate;
    forming an interlayer dielectric layer on the pattern of the semiconductor layer;
    forming a first photoresist pattern on the interlayer dielectric layer, the first photoresist pattern including first-thickness photoresist and second-thickness photoresist; the first-thickness photoresist corresponding to an area, at which a channel region is to be formed, in the pattern of the semiconductor layer; the second-thickness photoresist corresponding to areas, at which a source lightly doped region and a drain lightly doped region are to be formed, in the pattern of the semiconductor layer; the first-thickness photoresist has a thickness greater than that of the second-thickness photoresist;
    performing heavily doped ion implantation on the pattern of the semiconductor layer by taking the first photoresist pattern as a barrier mask, and forming patterns of a source heavily doped region and a drain heavily doped region;
    performing ashing treatment on the first photoresist pattern, so as to remove the second-thickness photoresist and reduce the thickness of the first-thickness photoresist, and form a second photoresist pattern;
    performing lightly doped ion implantation on the pattern of the semiconductor layer by taking the second photoresist pattern as a barrier mask, and forming patterns of the channel region, the source lightly doped region and the drain lightly doped region; and
    removing the second photoresist pattern.

2. The method for manufacturing the TFT according to claim 1, wherein a source of the TFT is formed by the source lightly doped region and the source heavily doped region; a drain of the TFT is formed by the drain lightly doped region and the drain heavily doped region; and the source and the drain has an interval therebetween so as to define the channel region.

3. The method for manufacturing the TFT according to claim 1, wherein the second-thickness photoresist is located on both sides of the first-thickness photoresist.

4. The method for manufacturing the TFT according to claim 1, wherein forming the first photoresist pattern includes:
    forming a photoresist film, performing exposure and development on the photoresist film via a multi-tone mask, and forming the first photoresist pattern, the first photoresist pattern including a photoresist-completely-retained region and photoresist-partially-retained regions; the photoresist-completely-retained region corresponding to the area, at which the channel region is to be formed, in the pattern of the semiconductor layer; and the photoresist-partially-retained regions corresponding to the areas, at which the source lightly doped region and the drain lightly doped region are to be formed, in the pattern of the semiconductor layer.

5. The method for manufacturing the TFT according to claim 1, wherein the multi-tone mask includes any one of a half-tone mask and a gray-tone mask.

6. The method for manufacturing the TFT according to claim 1, further comprising forming a pattern of a gate electrode, wherein the pattern of the gate electrode is formed before forming of the pattern of the semiconductor layer.

7. The method for manufacturing the TFT according to claim 1, further comprising forming a buffer layer, wherein the buffer layer is disposed between the pattern of the gate electrode and the pattern of the semiconductor layer.

8. The method for manufacturing the TFT according to claim 1, wherein the material of the semiconductor layer includes polycrystalline silicon (poly-Si).

9. The method for manufacturing the TFT according to claim 1, wherein n-type doping is performed in the heavily doped ion implantation process and the lightly doped ion implantation process.

10. The method for manufacturing the TFT according to claim 9, wherein doped ions are phosphorus ions.

11. A method for manufacturing an array substrate, comprising the method for manufacturing the TFT according to claim 1.

12. The method for manufacturing the array substrate according to claim 11, wherein a source of the TFT is formed by the source lightly doped region and the source heavily doped region; a drain of the TFT is formed by the drain lightly doped region and the drain heavily doped region; and the source and the drain has an interval therebetween so as to define the channel region.

13. The method for manufacturing the array substrate according to claim 11, wherein the second-thickness photoresist is located on both sides of the first-thickness photoresist.

14. The method for manufacturing the array substrate according to claim 11, wherein forming the first photoresist pattern includes:

forming a photoresist film, performing exposure and development on the photoresist film via a multi-tone mask, and forming the first photoresist pattern, the first photoresist pattern including a photoresist-completely-retained region and photoresist-partially-retained regions; the photoresist-completely-retained region corresponding to the area, at which the channel region is to be formed, in the pattern of the semiconductor layer; and the photoresist-partially-retained regions corresponding to the areas, at which the source lightly doped region and the drain lightly doped region are to be formed, in the pattern of the semiconductor layer.

15. The method for manufacturing the array substrate according to claim 11, wherein the multi-tone mask includes any one of a half-tone mask and a gray-tone mask.

* * * * *